US012683567B2

(12) United States Patent
Shou et al.

(10) Patent No.: US 12,683,567 B2
(45) Date of Patent: Jul. 14, 2026

(54) INPUT STAGE CIRCUIT FOR AN OPERATIONAL AMPLIFIER WITH ENHANCED INPUT OFFSET VOLTAGE TRIMMING CAPABILITIES

(71) Applicant: ZJW Microelectronics North America Inc., Wilmington, MA (US)

(72) Inventors: Xiaoqiang Shou, Westford, MA (US); Ziqing Lu, Shanghai (CN)

(73) Assignee: ZJW MICROELECTRONICS NORTH AMERICA INC., Wilmington, MA (US)

( * ) Notice: Subject to any disclaimer, the term of this patent is extended or adjusted under 35 U.S.C. 154(b) by 426 days.

(21) Appl. No.: 18/370,548

(22) Filed: Sep. 20, 2023

(65) Prior Publication Data

US 2025/0088158 A1 Mar. 13, 2025

(30) Foreign Application Priority Data

Sep. 12, 2023 (CN) .......................... 202311176356.6

(51) Int. Cl.
*H03F 3/45* (2006.01)

(52) U.S. Cl.
CPC ..... *H03F 3/45995* (2013.01); *H03F 3/45112* (2013.01); *H03F 3/4521* (2013.01); *H03F 3/45623* (2013.01); *H03F 3/45771* (2013.01); *H03F 2203/45026* (2013.01); *H03F 2203/45032* (2013.01); *H03F 2203/45038* (2013.01); *H03F 2203/45136* (2013.01)

(58) Field of Classification Search
CPC ........................................................ H03F 3/45

USPC ................................................... 330/252, 261
See application file for complete search history.

(56) References Cited

U.S. PATENT DOCUMENTS

| | | | | |
|---|---|---|---|---|
| 4,618,833 | A | 10/1986 | Russell | |
| 4,797,631 | A | 1/1989 | Hsu et al. | |
| 5,610,557 | A * | 3/1997 | Jett, Jr. | H03F 3/45121 |
| | | | | 330/261 |
| 6,194,962 | B1 * | 2/2001 | Chen | H03F 3/45766 |
| | | | | 330/253 |
| 6,696,894 | B1 * | 2/2004 | Huang | H03F 3/45766 |
| | | | | 330/253 |
| 7,170,347 | B1 * | 1/2007 | Kindt | H03F 3/45183 |
| | | | | 330/253 |
| 10,924,066 | B2 * | 2/2021 | Purdila | H03F 3/45179 |

(Continued)

*Primary Examiner* — Henry Choe
(74) *Attorney, Agent, or Firm* — KRIEGSMAN & KRIEGSMAN

(57) ABSTRACT

An input stage circuit for an operational amplifier includes first and second differential pairs connected in parallel between positive and negative input terminals. Each differential pair comprises a pair of transistors that are intentionally and systematically mismatched. The mismatching of each transistor pair creates a pre-trim input offset voltage for the circuit. However, a unique current is utilized to bias each of the first and second differential pairs. By adjusting the differential between the bias currents, a composite input offset voltage is created that combines with the pre-trim input offset voltage to yield a total input offset voltage for the circuit that approaches zero. Additionally, adjusting the differential between the bias currents simultaneously trims the temperature coefficient of the total input offset voltage to zero while using limited power and producing minimal noise.

11 Claims, 4 Drawing Sheets

(56)                       References Cited

U.S. PATENT DOCUMENTS

| | | | |
|---|---|---|---|
| 2003/0214351 A1 | 11/2003 | Nandy et al. | |
| 2018/0323748 A1 * | 11/2018 | Motoroiu ............ | H03F 3/45672 |
| 2020/0136577 A1 | 4/2020 | Ivanov et al. | |

* cited by examiner

INPUT STAGE CIRCUIT FOR AN OPERATIONAL AMPLIFIER WITH ENHANCED INPUT OFFSET VOLTAGE TRIMMING CAPABILITIES

FIELD OF THE INVENTION

The present invention relates generally to the field of operational amplifiers and, more particularly, to techniques for trimming the input offset voltage of an operational amplifier.

BACKGROUND OF THE INVENTION

An operational amplifier, or op-amp, is a high-gain differential amplifier that exhibits high stability and linear characteristics. Due to its relatively low cost, operational amplifiers are commonly utilized in a wide variety of electronic devices, such as medical instruments and consumer electronics, to provide, inter alia, signal amplification, oscillation, and filtering capabilities.

An operational amplifier typically includes multiple amplifier stages in order to achieve very high voltage gain. The input, or first, stage of an op-amp circuit most commonly includes first and second differential pairs connected in parallel between two high-impedance input terminals. Each differential pair comprises a pair of transistors that ideally form two symmetrical circuit branches, with each transistor connected to a corresponding input terminal. The first differential pair is typically biased with a first current source connected to a negative supply voltage and the second differential pair is biased with a second current source connected to a positive supply voltage.

During normal operation, each branch of a differential pair produces a signal proportional to the voltage on its corresponding input terminal. The output produced by each differential pair is the current signal difference between its two branches. Typically, outputs from the first and second differential pairs are combined together to yield a single output. In this manner, the above-described input stage circuit is designed to handle rail-to-rail input common mode voltages. In other words, at least one differential input pair remains active as the common-mode voltage varies between the rails.

Traditionally, the values of the transistors that form each differential pair are matched to the greatest extent possible to create symmetry between its branches. Accordingly, when identical voltages are applied to the pair of input terminals, the corresponding signal within each branch of the differential pair should be identical and thereby produce an output signal of zero.

However, in actuality, the branches within a typical differential pair are not exactly identical. Rather, manufacturing tolerances often create slight variances in the values of each matched pair of transistors, thereby creating asymmetry within each differential pair. Due to the slight differences in the characteristics of the branches of each differential pair, the measured output signal produced by the input stage circuit when both input terminals are of the same potential is a non-zero value. To compensate for this error, a voltage difference can be applied to the input terminals of the op-amp to produce an output signal of zero, this voltage difference being commonly referred to in the art as the input offset voltage for the operational amplifier circuit.

As can be appreciated, an input offset voltage in the millivolt range appears as an error in the amplifier output. As a result, the input offset voltage of an amplifier is considered a critical parameter in determining its accuracy as well as the overall precision of any device or system within which it is utilized. Accordingly, in order to minimize the potentially deleterious effects of input offset voltage on the accuracy of an amplifier, an operational amplifier is often designed to implement trimming technique that reduces the input offset voltage to as close to zero as possible.

As one input offset voltage trimming technique, an operational amplifier is often designed with variable resistors, as shown in U.S. Pat. No. 5,610,557 to W. B. Jett, Jr., the disclosure of which is incorporated herein by reference. As part of this trimming technique, a resistor is connected in series between each transistor and its associated supply voltage. Thereafter, the resistance of each resistor is modified in a precise fashion, such as through a laser trimming process. By precisely varying the resistance of each resistor, the output current of the input stage can be modified in proportion to the measured asymmetry in order to minimize any input offset voltage produced by the operational amplifier.

Although known and widely utilized in the art, the aforementioned trimming technique has been found to incur a few notable shortcomings. In particular, the resistance adjustment process is a relatively complex and laborious process that significantly increases the overall testing period during manufacture. Additionally, the incorporation of variable resistors into the input stage circuit substantially increases the required layout area for the amplifier.

As another input offset voltage trimming technique, an operational amplifier circuit is often designed with an electronic component, such as a resistive digital-to-analog converter, which is configured with a code to trim the offset voltage. An example of this type of circuit is disclosed in U.S. Patent Application Publication No. 2020/0136577 to V. Ivanov et al., the disclosure of which is incorporated herein by reference.

Although known and widely utilized in the art, the operational amplifier circuitry required to implement such a trimming technique has been found to incur a few notable shortcomings. In particular, the incorporation of an additional electronic component that is specifically designed to trim the offset voltage creates an increase in the power and layout area requirements as well as the resultant noise associated with the circuit.

SUMMARY OF THE INVENTION

It is an object of the present invention to provide a new and improved input stage circuit for an operational amplifier.

It is another object of the present invention to provide an input stage circuit for an operational amplifier that is designed to implement a novel input offset voltage trimming technique.

It is yet another object of the present invention to provide an input stage circuit as described above which is designed to implement an input offset voltage trimming technique that requires limited power and generates minimal noise.

It is still another object of the present invention to provide an input stage circuit as described above which has a limited number of parts, requires a minimal layout area, and can be efficiently manufactured.

Accordingly, as one feature of the present invention, there is provided an input stage circuit for an operational amplifier having first and second input terminals, the input stage circuit comprising (a) a first differential pair connected to the first and second input terminals, the first differential pair comprising a pair of transistors that are mismatched, and (b)

a second differential pair connected to the first and second input terminals in parallel with the first differential pair, the second differential pair comprising a pair of transistors that are mismatched, (c) wherein the first differential pair is biased with a first current and the second differential pair is biased with a second current, the first and second currents being unequal.

Various other features and advantages will appear from the description to follow. In the description, reference is made to the accompanying drawings which form a part thereof, and is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings, wherein like reference numerals represent like parts.

DETAILED DESCRIPTION OF THE INVENTION

Input Stage Circuit 11

Figure 1:
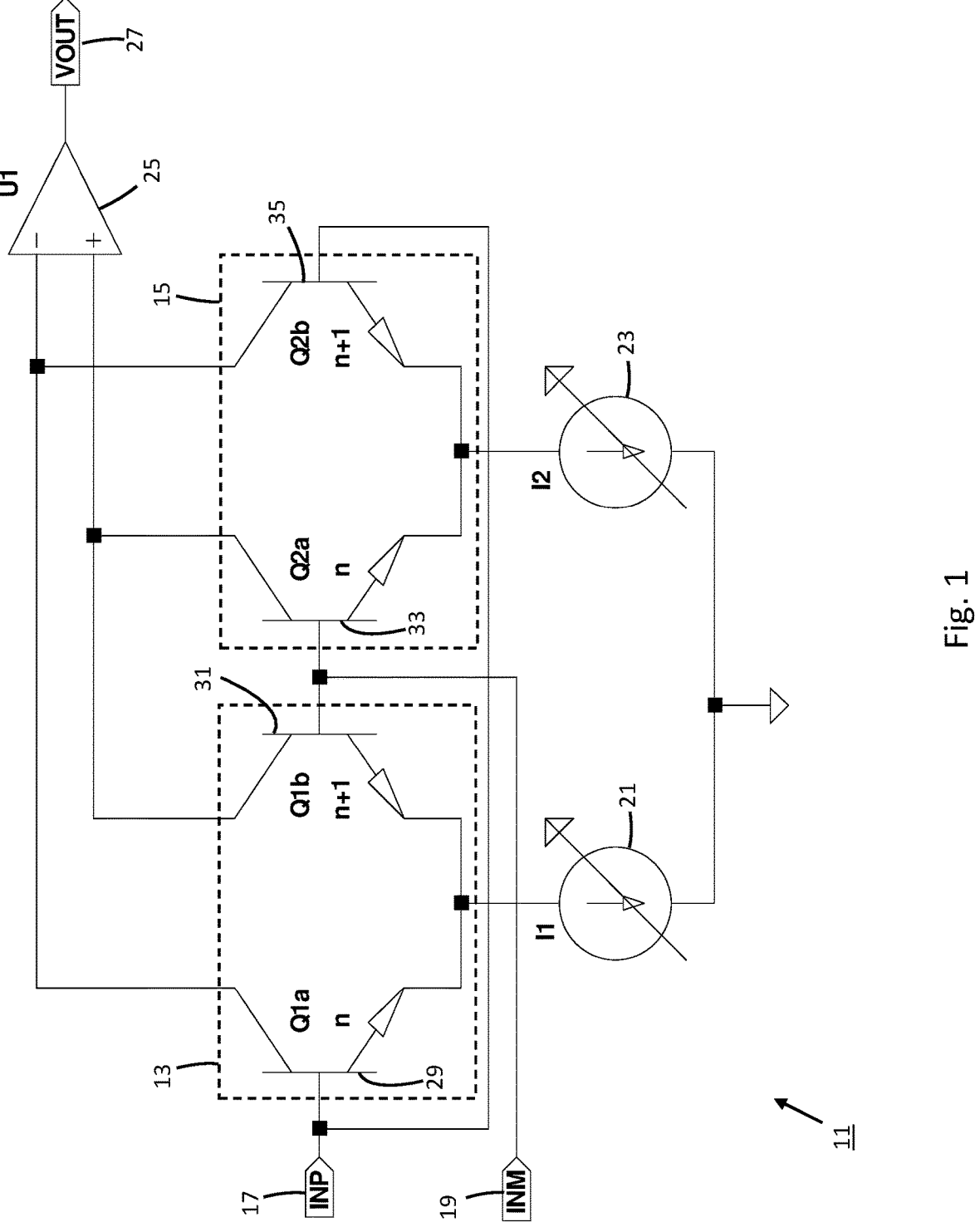
FIG. 1 is a schematic representation of an input stage circuit for an operational amplifier, the input stage circuit being constructed according to the teachings of the present invention.

Referring now to FIG. 1, there is shown a schematic representation of an input stage circuit for an operational amplifier, the input stage circuit being constructed according to the teachings of the present invention and defined generally by reference numeral 11. As will be described in detail below, input stage circuit 11 is uniquely designed to implement a novel input offset voltage trimming technique that requires limited power, testing time, and layout area, while producing minimal noise.

As can be seen, input stage circuit 11 comprises (i) first and second differential pairs 13 and 15 connected in parallel between a positive input terminal 17 and a negative input terminal 19, (ii) a first current source 21 that produces a first current I1 for biasing first differential pair 13, (iii) a second current source 23 that produces a second current I2 for biasing second differential pair 15, and (iv) an amplifier 25 for combining the outputs of first and second differential pairs 13 and 15 to form a single output terminal 27.

As will be explained further below, differential pairs 13 and 15 are uniquely configured to implement a novel input offset voltage trimming technique. More specifically, the transistor pair that forms each of differential pairs 13 and 15 is intentionally and systematically mismatched, which runs contrary to conventional practice. This systematic mismatching of transistor pairs creates asymmetry within each of differential pairs 13 and 15 that would ordinarily create a significant input offset voltage for circuit 11. However, the present invention exploits the designed asymmetry within each of differential pairs 13 and 15 in order to implement a novel technique for trimming the input offset voltage that requires limited power, uses simple topology, produces minimal noise, and shortens testing time.

First differential pair 13 comprises a first NPN bipolar junction transistor 29 (also referred to herein as transistor Q1a) and a second NPN bipolar junction transistor 31 (also referred to herein as transistor Q1b). As can be seen, base terminal of transistor 29 is connected to positive input terminal 17 and base terminal of transistor 31 is connected to negative input terminal 19. Additionally, the collector terminal of transistor 29 is connected to the negative input of amplifier 25 and the collector terminal of transistor 31 is connected to the positive input of amplifier 25. Furthermore, the emitter terminals of transistors 29 and 31 are coupled together and connected in series to ground by first current source 21.

Similar to first differential pair 13, second differential pair 15 comprises a first NPN bipolar junction transistor 33 (also referred to herein as transistor Q2a) and a second NPN bipolar junction transistor 35 (also referred to herein as transistor Q2b). As can be seen, base terminal of transistor 35 is connected to positive input terminal 17 and base terminal of transistor 33 is connected to negative input terminal 19. Additionally, the collector terminal of transistor 35 is connected to the negative input of amplifier 25 and the collector terminal of transistor 33 is connected to the positive input of amplifier 25. Furthermore, the emitter terminals of transistors 33 and 35 are coupled together and connected in series to ground by second current source 23.

It should be noted that circuit 11 is not limited to any particular type, channel, mode, and/or configuration of transistors Q1a, Q1b, Q2a, and Q2b. Rather, it is to be understood that circuit 11 could be similarly constructed using alternative types, channels, modes, and/or configurations of transistors Q1a, Q1b, Q2a, and Q2b without departing from the spirit of the present invention.

As noted above, the values of transistors Q1a and Q1b are intentionally and systematically mismatched. Similarly, the values of transistors Q2a and Q2b are intentionally and systematically mismatched. This intentional mismatching of transistors creates asymmetry through each of differential pairs 13 and 15. However, applicant has uniquely recognized that, using known the characteristics of each mismatched pair, the current differential between transistors can be calculated. In turn, current source devices 21 and 23 can be set relative to one another to correct for this current differential between transistors. As a result, the total input offset voltage for circuit 11 can be substantially reduced.

In the present embodiment, the mismatching between each differential pair of transistors is based on certain geometric, or dimensional, characteristics. Notably, the value of a transistor that is used herein for matching purposes is preferably the area of its emitter region, or emitter area, for bipolar devices. However, it is to be understood that other measurable characteristics of a transistor could be similarly utilized for matching purposes, such as its base-to-collector current gain, device multiple, or amplification factor, which is a constant that typically falls in the range from 10 to 500 but may vary slightly based on certain environmental factors.

In the present embodiment, transistor Q1a is designated with a measured transistor value of n. Preferably, transistor Q1b is selected with a measured transistor value of n+1 in order to create a known, systematic mismatch from transistor Q1a. In a similar fashion, transistor Q2a preferably has the same measured transistor value of n as transistor Q1a, with transistor Q2b being selected with a measured transistor value of n+1 in order to create a known, systematic mismatch from transistor Q2a. As a result, although each differential pair is intentionally mismatched, together first and second differential pairs 13 and 15 provide an overall symmetry to circuit 11 that ensures optimal performance.

As can be seen, circuit 11 has a simple topology and can be readily manufactured. Additionally, as will be explained further below, circuit 11 is uniquely designed to implement a novel technique for effectively trimming the input offset voltage using limited power and generating minimal noise.

Novel Technique for Trimming Input Offset Voltage

As referenced above, input stage circuit 11 is uniquely designed to implement a novel technique for effectively trimming input offset voltage. As will be shown below, the unique construction of input stage circuit 11 allows for the implementation of an input offset voltage trimming technique that can be efficiently rendered, requires limited power, and generates minimal noise.

Specifically, the intentional mismatching between transistors Q1a and Q1b as well as Q2a and Q2b creates an equivalent emitter area ratio of n:n+1 for each of differential pairs 13 and 15, respectively. If Vos1 represents the intrinsic input offset voltage for differential pair 13 and Vos2 represents the intrinsic input offset voltage for differential pair 15, the following equations can be readily derived:

$$Vos1 = Vt * \ln\left(\frac{n+1}{n}\right) \quad [1]$$

$$Vos2 = -Vos1 \quad [2]$$

$$Vt = \frac{KT}{q} \quad [3]$$

wherein Vt represents the thermal voltage associated with each bipolar junction transistor, K represents Boltzmann constant, T represents absolute temperature, and q represents electron charge. Additionally, it is known that the thermal voltage, Vt, for a bipolar junction transistor is typically about 26 mV at 27° C. (i.e., room temperature).

The intrinsic input offset voltage Vos1 for differential pair 13 is proportional to absolute temperature (PTAT) regardless of the bias current applied thereto by current source 21. Therefore, the first order derivative of Vos1 related to temperature, or TCVos1, can be represented using the following equation:

$$TCVos1 = \frac{dVos1}{dT} = \frac{K}{q} \ln\left(\frac{n+1}{n}\right) \quad [4]$$

As can be seen, the temperature coefficient of input offset voltage, TCVos1, for differential pair 13 is a constant value and is only dependent upon the utilized mismatch ratio n:n+1 for transistors Q1a and Q1b.

For a differential pair designed with an intentionally mismatched transistor pair, the relationship between the mismatch ratio (n:n+1), the input offset voltage (Vos1), and the temperature coefficient of input offset voltage (TCVos1) for the differential pair can be readily calculated. An illustrative set of results is represented below in Table 1.

TABLE 1

| n | Vos1 (mV) | TCVos1 (uV/° C.) |
|---|---|---|
| 10 | 2.478064675 | 8.315653272 |
| 20 | 1.268544268 | 4.256859961 |
| 30 | 0.852535393 | 2.860857025 |
| 40 | 0.642007927 | 2.154389018 |
| 50 | 0.51486831 | 1.727746006 |

As can be appreciated, the smaller the value of n selected for the transistors in the differential pair, the larger the degree of mismatch therebetween (i.e., the larger the mismatch ratio n:n+1). Furthermore, as shown in Table 1, a decrease in the mismatch ratio (n:n+1) produces a commensurate increase in both the input offset voltage (Vos1) and the temperature coefficient of input offset voltage (TCVos1) for the differential pair.

The overall, or total, input offset voltage, or Vos_tot, for circuit 11 can be calculated using the following formula:

$$Vos\_tot = \frac{Vos1 * gm1 + Vos2 * gm2}{gm1 + gm2} \quad [5]$$

where gm1 and gm2 represent the transconductance of the transistor pair for each of differential pairs 13 and 15, respectively. Assuming n is much greater than 1 (e.g., n>10), the transistor mismatch produces a negligible effect on transconductance. As a result, the bipolar transistor differential transconductance for each of differential pairs 13 and 15 can be represented as:

$$gm1 = \frac{I1}{Vt} \quad [6]$$

$$gm2 = \frac{I2}{Vt} \quad [7]$$

Using the above values for gm1 and gm2, the overall input offset voltage for input stage circuit 11 can be represented by the formula:

$$Vos\_tot = \frac{Vos1 * (I1 - I2)}{I1 + I2} \quad [8]$$

Accordingly, if the bias currents applied from current sources 21 and 23 are equal (i.e., I1=I2), the overall input offset voltage, Vos_tot, for circuit 11 is zero. However, as will be explained further below, if the bias currents applied from current sources 21 and 23 are unequal, a secondary input offset voltage is created, which can be adjusted to drive the final input offset voltage for circuit 11 to zero.

Using equation [8] above, bias currents I1 and I2 applied from current sources 21 and 23, respectively, can be adjusted to modify the overall input-referred offset voltage for circuit 11. Another constraint when setting bias currents I1 and I2 is its effect on the total transconductance of input stage circuit 11. The total transconductance, or gmtot, of circuit 11 can be represented by the following formula:

$$gmtot = gm1 + gm2 \qquad [9]$$

In the design of an amplifier, it is typically desirable to maintain total transconductance, or gmtot, as a constant. Therefore, in a similar fashion, it is desirable to maintain the total bias current, or Itot, as a constant, with the total bias current, Itot, being represented by the following formula:

$$I1 + I2 = Itot \qquad [10]$$

For any practical amplifier, the pre-trim input offset voltage, or Vos0, is dependent upon the input offset voltage of each differential pair, mismatching of active loads, and/or load resistance. Taking advantage of the overall, or composite, input offset voltage, Vos_tot, the final input offset voltage, or Vosf, for circuit 11 can be corrected using the following formulas:

$$Vosf = Vos0 + Vostot \qquad [11]$$

$$\Delta I = I1 - I2 = \frac{-Vos0 * K * T}{q * \ln\left(\frac{n+1}{n}\right)} * Itot \qquad [12]$$

In other words, through the precise adjustment of bias currents I1 and I2, the composite input offset voltage Vos_tot can be configured with a negative value that matches the pre-trim input offset voltage Vos0 and thereby effectively trim the final input offset voltage, or Vosf, to zero.

In a similar fashion, current sources 21 and 23 can be adjusted to trim the temperature coefficient of input offset voltage, or TCVos, to zero. Specifically, by applying equation [9] to equation [5], the temperature coefficient of the total input offset voltage, or TCVostot, for circuit 11 can be represented by the following formula:

$$TCVostot = \frac{dVostot}{dT} = \ln\left(\frac{n+1}{n}\right) * \frac{1}{gmtot} * \frac{d(I1 - I2)}{dT} \qquad [13]$$

Assuming a pre-trim input offset temperature coefficient of voltage, or TCVos0, for circuit 11, the post-trim input offset temperature coefficient of voltage, or TCVosf, can be represented by the following formula:

$$TCVosf = TCVos0 + TCVostot \qquad [14]$$

Therefore, by utilizing bias currents I1 and I2 with a certain temperature coefficient, the post-trim input offset temperature coefficient of voltage, or TCVosf, can be effectively trimmed to zero, as shown in the following formula:

$$\frac{d(I1 - I2)}{dT} = \frac{d(\Delta I)}{dT} = -TCVos0 * \frac{gmtot}{\ln\left(\frac{n+1}{n}\right)} \qquad [15]$$

To summarize, the intentional asymmetric design of differential pairs 13 and 15 and corresponding use of unequal bias currents I1 and I2 enables both the total input offset voltage, or Vostot, and the temperature coefficient of the total input offset voltage, or TCVostot, for input stage circuit 11 to be simultaneously trimmed to zero by simply adjusting the differential of bias currents I1 and I2 generated from current sources 21 and 23.

Alternative Constructions and Design Modifications

The invention described in detail above is intended to be merely exemplary and those skilled in the art shall be able to make numerous variations and modifications to it without departing from the spirit of the present invention. All such variations and modifications are intended to be within the scope of the present invention as defined in the appended claims.

For instance, as referenced above, input stage circuit 11 is not limited to the use of NPN bipolar junction transistors to form each of differential pairs 13 and 15. Rather, it is to be understood that alternative types of transistors could be used in place thereof without departing from the spirit of the present invention.

Figure 2:
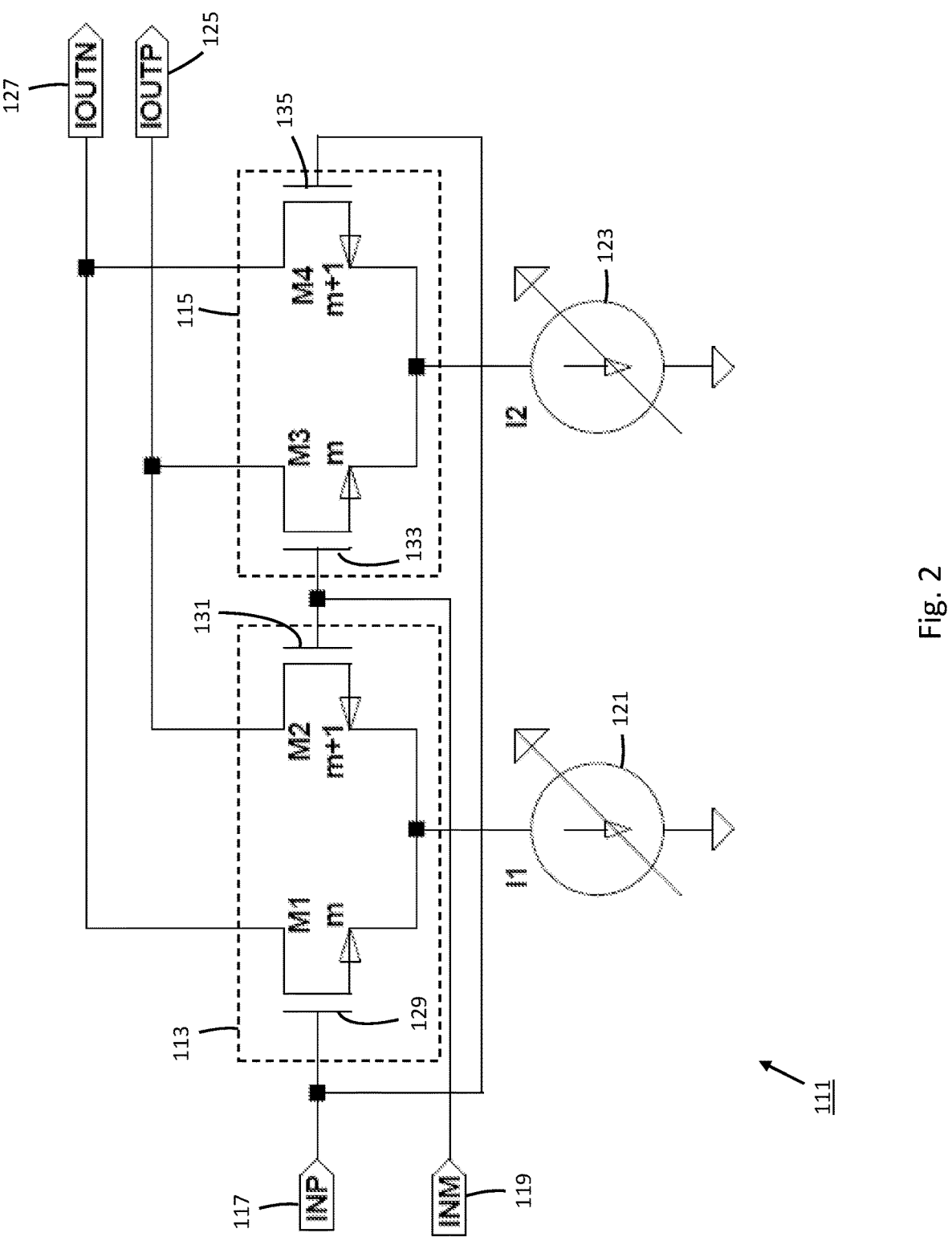
FIG. 2 is a schematic representation of a first modification of the input stage circuit shown in FIG. 1, the first modified input stage circuit being constructed according to the teachings of the present invention.

As an example, in FIG. 2, there is shown a schematic representation of a second embodiment of an input stage circuit for an operational amplifier, the input stage circuit being constructed according to the teachings of the present invention and defined generally by reference numeral 111. As can be seen, input stage circuit 111 is similar to input stage circuit 11 in that circuit 111 comprises (i) first and second differential pairs 113 and 115 connected in parallel between a positive input terminal 117 and a negative input terminal 119, (ii) a first current source 121 that produces a first current I1 for biasing first differential pair 113, and (iii) a second current source 123 that produces a second current I2 for biasing second differential pair 115, (iv) wherein outputs from first and second differential pairs 113 and 115 are selectively combined to form a positive output terminal 125 and a negative output terminal 127.

Input stage circuit 111 differs primarily from input stage circuit 11 in the type of transistors utilized to form each first and second differential pairs 113 and 115. Specifically, first differential pair 113 comprises a first N-channel metal oxide semiconductor field-effect transistor (MOSFET) 129 (also referred to herein as MOSFET M1) and a second N-channel MOSFET 131 (also referred to herein as MOSFET M2). Similarly, second differential pair 115 comprises a first N-channel MOSFET 133 (also referred to herein as MOSFET M3) and a second N-channel MOSFET 135 (also referred to herein as MOSFET M4).

Similar to input stage circuit 11, the values of MOSFETs M1 and M2, as well as MOSFETs M3 and M4, are intentionally and systematically mismatched. In the present embodiment, the mismatching between each differential pair of MOSFETs is based on the W/L aspect ratio for each MOSFET (i.e., the ratio of the induced channel width (W) relative to the induced channel length (L)). However, it is to be understood that value mismatching might be based on other factors, such as device multiple, gate finger number, or the like. To ensure adequate mismatching, MOSFET M1 is preferably designated with W/L aspect ratio of m, and MOSFET M2 is selected with a measured W/L aspect ratio of m+1. Similarly, MOSFET M3 is preferably designated with W/L aspect ratio of m, and MOSFET M4 is selected with a measured W/L aspect ratio of m+1.

In use, input stage circuit 111 operates in a largely similar fashion to input stage circuit 11 even with transistors Q1*a*, Q1*b*, Q2*a*, and Q2*b* in circuit 11 being replaced with N-channel MOSFETs M1, M2, M3, and M4, respectively, in circuit 111. However, the closed-form expressions utilized to calculate, and consequently trim, the input offset voltage, Vos, and the temperature coefficient of the input offset voltage, TCVos, for circuit 111 are considerably more mathematically complex due to the square law nature of a conventional MOSFET.

Figure 3:
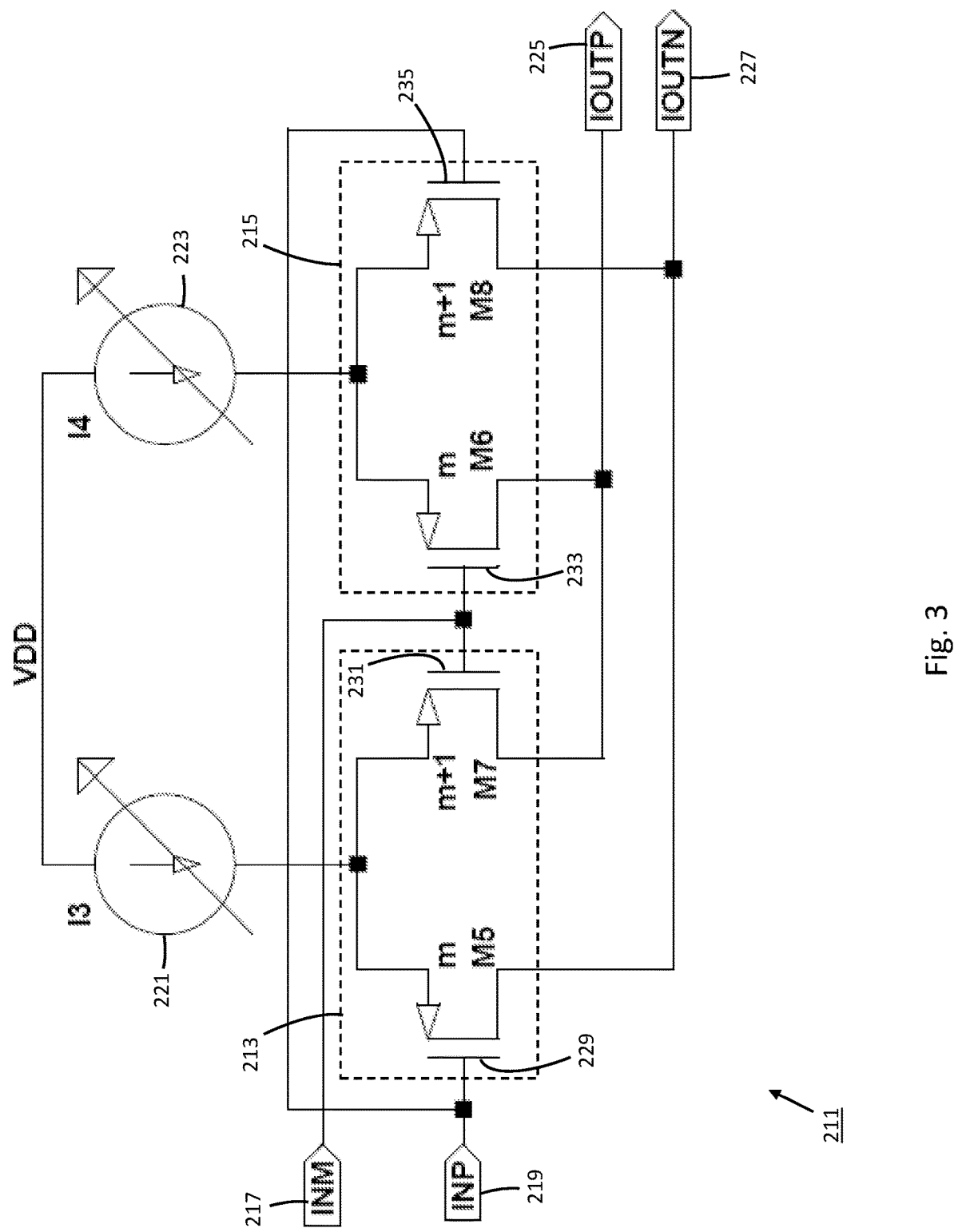
FIG. 3 is a schematic representation of a second modification of the input stage circuit shown in FIG. 1, the second modified input stage circuit being constructed according to the teachings of the present invention.

As another example, in FIG. 3, there is shown a schematic representation of a third embodiment of an input stage circuit for an operational amplifier, the input stage circuit being constructed according to the teachings of the present invention and defined generally by reference numeral 211. As can be seen, input stage circuit 211 is similar to input stage circuit 111 in that circuit 211 comprises (i) first and second differential pairs 213 and 215 connected in parallel between a positive input terminal 217 and a negative input terminal 219, (ii) a first current source 221 that produces a first current I3 for biasing first differential pair 213, and (iii) a second current source 223 that produces a second current I4 for biasing second differential pair 215, (iv) wherein outputs from first and second differential pairs 213 and 215 are selectively combined to form a positive output terminal 225 and a negative output terminal 227.

Input stage circuit 211 is also similar to input stage circuit 111 in that MOSFTETs are utilized to form each first and second differential pairs 213 and 215. However, it should be noted that P-channel MOSFETs are used in place of N-channel MOSFETs. Accordingly, first differential pair 213 comprises a first P-channel MOSFET 229 (also referred to herein as MOSFET M5) and a second P-channel MOSFET 231 (also referred to herein as MOSFET M7). Similarly, second differential pair 215 comprises a first P-channel MOSFET 233 (also referred to herein as MOSFET M6) and a second P-channel MOSFET 235 (also referred to herein as MOSFET M8).

Similar to input stage circuit 111, the values of MOSFETs M5, M6, M7, and M8 are intentionally and systematically mismatched. Specifically, MOSFETs M5 and M6 are preferably designated with W/L aspect ratio of m, and MOSFETs M7 and M8 are selected with a measured W/L aspect ratio of m+1. As a result, adequate transistor mismatching is ensured for each of differential pairs 213 and 215.

Figure 4:
FIG. 4 is a schematic representation of a rail-to-rail input stage circuit for an operational amplifier that incorporates design elements of the input stage circuits shown in FIGS. 2 and 3, the rail-to-rail input stage circuit being constructed according to the teachings of the present invention.

It should be noted that the novel design and input offset trim capabilities of circuits 11, 111, and 211 could be incorporated into a wide variety of potential applications. For example, in FIG. 4, there is shown a schematic representation of a rail-to-rail input stage circuit for an operational amplifier, the input stage circuit being constructed according to the teachings of the present invention and defined generally by reference numeral 311. As will be described in detail below, input stage circuit 311 incorporates design elements of circuits 111 and 211 to create a rail-to-rail input stage circuit with enhanced trimming capabilities.

As can be seen, Input stage circuit 311 comprises (i) a first set of differential pairs 313 connected in parallel between a positive input terminal 317 and a negative input terminal 319, (ii) a second set of differential pairs 315 connected in parallel between positive input terminal 317 and negative input terminal 319, (iii) a first digital-to-analog converter (DAC) 321 connected to a current source IBIAS for adjusting the amperage of a first pair of bias currents that is delivered to first set of differential pairs 313 by a trim circuit 322, (iv) a second digital-to-analog converter (DAC) 323 connected to current source IBIAS for adjusting the amperage of a second pair of bias currents that is delivered to second set of differential pairs 315 through a trim circuit 324, (v) a switch circuit 325 for regulating the operation of first and second sets of differential pairs 313 and 315, and (vi) first and second cascode amplifiers 327 and 329 connected to the outputs of first and second sets of differential pairs 313 and 315, respectively.

It should be noted that first set of differential pairs 313 is similar in design and operation to differential pairs 113 and 115 in circuit 111. Notably, first set of differential pairs 313 includes two pairs of N-channel MOSFETs M1, M2, M3, and M4, with each pair intentionally and systematically mismatched to enable the novel trimming technique of the present invention to be implemented. Similarly, it should be noted that second set of differential pairs 315 is similar in design and operation to differential pairs 213 and 215. Notably, second set of differential pairs 315 includes two pairs of P-channel MOSFETS M5, M6, M7, and M8, with each pair intentionally and systematically mismatched to enable the novel trimming technique of the present invention to be implemented.

In use, input stage circuit 311 is designed to operate in the following manner. Specifically, when the common input mode voltage applied to terminals 317 and 319 is between the switch voltage, Vsw, of voltage-controlled switch circuit 325 and ground (i.e., is low), second set of differential pairs 315 turns on and first set of differential pairs 313 turns off. By contrast, when the common mode input voltage applied to terminals 317 and 319 is between the switch voltage, Vsw, of switch circuit 315 and the positive supply voltage, VDD, (i.e., is high), second set of differential pairs 315 turns off and first set of differential pairs 313 turns on. As a result, circuit 311 is able to operate when the input common mode voltage varies through the entire voltage supply range (i.e., from rail to rail).

The input offset voltage trimming function for second set of differential pairs 315 is implemented by trim circuit 324. As can be seen, trim circuit 324 comprises a pair of P-channel MOSFETs M18 and M19. DAC 323 is designed to generate a differential voltage which is applied to the gates of MOSFETs M18 and M19. In this manner, the differential voltage provided from DAC 323 to trim circuit 324 is utilized to adjust the drain currents delivered to MOSFETs M5, M6, M7, and M8. As explained in detail above, this ability to calculate and precisely adjust the difference between the two bias currents delivered to the set of differential pairs enables the input offset voltage, Vos, for second set of differential pairs 315 to be effectively trimmed to zero.

In a similar fashion, the input offset voltage trimming function for first set of differential pairs 313 is implemented by trim circuit 322. As can be seen, trim circuit 322 comprises a pair of N-channel MOSFETs M11 and M12. DAC 321 is designed to generate a differential voltage which is applied to the gates of MOSFETs M11 and M12. In this manner, the differential voltage provided from DAC 321 to trim circuit 322 is utilized to adjust the drain currents delivered to MOSFETs M1, M2, M3, and M4. As referenced above, this ability to calculate and precisely adjust the difference between the two bias currents delivered to the set of differential pairs enables the input offset voltage, Vos, for first set of differential pairs 313 to be effectively trimmed to zero.

As compared to conventional amplifier circuits and corresponding techniques applied thereto in order to trim any non-zero input offset voltage, the present invention yields a number of notable advantages.

As a first advantage, the input stage circuit of the present invention does not require an increase in power in order to trim its input offset voltage. In fact, the total current utilized to bias each differential pair remains unchanged from a traditional amplifier circuit without trimming capabilities. Instead, the difference between the pair of tail currents is adjusted to implement the trimming technique of the present invention.

As a second advantage, the input stage circuit of the present invention is designed to implement a technique for trimming input offset voltage that does not increase the overall noise of the amplifier.

As a third advantage, the input stage circuit of the present invention is designed with a compact layout and is well suited for post-package trimming through its leads. As a result, the input stage circuit of the present invention can be manufactured and tested in a simple and inexpensive fashion.

What is claimed is:

1. An input stage circuit for an operational amplifier having first and second input terminals, the input stage circuit comprising:

(a) a first differential pair connected to the first and second input terminals, the first differential pair comprising a pair of transistors that are mismatched; and (b) a second differential pair connected to the first and second input terminals in parallel with the first differential pair, the second differential pair comprising a pair of transistors that are mismatched;

(c) wherein the first differential pair is biased with a first current and the second differential pair is biased with a second current, the first and second currents being unequal;

(d) wherein mismatching of the pair of transistors in each of the first and second differential pairs creates a pre-trim input offset voltage for the input stage circuit;

(e) wherein at least one of the first and second currents is adjusted relative to the other to reduce the pre-trim input offset voltage created by the input stage circuit.

2. The input stage circuit as claimed in claim 1 wherein at least one of the first and second currents is adjusted relative to the other to create a composite input offset voltage which is combined with the pre-trim input offset voltage to create a final input offset voltage of zero.

3. The input stage circuit as claimed in claim 2 wherein mismatching of the pair of transistors in each of the first and second differential pairs creates a pre-trim temperature coefficient of input offset voltage.

4. The input stage circuit as claimed in claim 3 wherein at least one of the first and second currents is adjusted relative to the other to reduce the pre-trim temperature coefficient of input offset voltage to zero.

5. The input stage circuit as claimed in claim 2 wherein the pair of transistors in each of the first and second differential pairs is mismatched in value.

6. The input stage circuit as claimed in claim 5 wherein the pair of transistors in each of the first and second differential pairs is mismatched in value with respect to emitter area.

7. The input stage circuit as claimed in claim 5 wherein the pair of transistors in each of the first and second differential pairs has a mismatch ratio of n:n+1.

8. The input stage circuit as claimed in claim 7 wherein each transistor in the first and second differential pairs is a bipolar junction transistor.

9. The input stage circuit as claimed in claim 7 wherein each transistor in the first and second differential pairs is a metal oxide semiconductor field-effect transistor.

10. The input stage circuit as claimed in claim 7 wherein each of the first and second differential pairs has an output, the outputs from the first and second differential pairs being combined to form at least one output terminal.

11. The input stage circuit as claimed in claim 10 wherein the outputs from the first and second differential pairs are combined by an amplifier.

* * * * *